United States Patent
Kneedler

(10) Patent No.: US 8,481,962 B2
(45) Date of Patent: Jul. 9, 2013

(54) DISTRIBUTED POTENTIAL CHARGED PARTICLE DETECTOR

(75) Inventor: Eric Kneedler, Portland, OR (US)

(73) Assignee: FEI Company, Hillsboro, OR (US)

( * ) Notice: Subject to any disclaimer, the term of this patent is extended or adjusted under 35 U.S.C. 154(b) by 324 days.

(21) Appl. No.: 12/854,008

(22) Filed: Aug. 10, 2010

(65) Prior Publication Data

US 2012/0037802 A1    Feb. 16, 2012

(51) Int. Cl.
*G21K 5/04*    (2006.01)

(52) U.S. Cl.
USPC ........................ 250/397; 250/396 R; 250/398

(58) Field of Classification Search
USPC ............. 250/306, 307, 309, 310, 311, 396 R, 250/397, 398, 396 ML
See application file for complete search history.

(56) References Cited

U.S. PATENT DOCUMENTS

| | | | |
|---|---|---|---|
| 5,578,822 A | 11/1996 | van der Mast et al. | |
| 6,236,053 B1 | 5/2001 | Shariv | |
| 6,365,898 B1 | 4/2002 | Sudraud et al. | |
| 7,009,187 B2 | 3/2006 | Gerlach et al. | |
| 2003/0010913 A1* | 1/2003 | Essers | ............................ 250/310 |
| 2006/0138359 A1* | 6/2006 | Maeda | ...................... 250/492.22 |
| 2008/0099674 A1* | 5/2008 | Bihr et al. | ...................... 250/307 |
| 2009/0294687 A1* | 12/2009 | Shofman et al. | ............... 250/397 |

FOREIGN PATENT DOCUMENTS

| | | |
|---|---|---|
| JP | 09-283072 | 10/1997 |
| JP | 2008-140723 | 6/2008 |

* cited by examiner

*Primary Examiner* — Nicole Ippolito
(74) *Attorney, Agent, or Firm* — Scheinberg & Associates, PC; Michael O. Scheinberg

(57) ABSTRACT

A charged particle beam system for imaging and processing targets is disclosed, comprising a charged particle column, a secondary particle detector, and a secondary particle detection grid assembly between the target and detector. In one embodiment, the grid assembly comprises a multiplicity of grids, each with a separate bias voltage, wherein the electric field between the target and the grids may be adjusted using the grid voltages to optimize the spatial distribution of secondary particles reaching the detector. Since detector lifetime is determined by the total dose accumulated at the area on the detector receiving the largest dose, detector lifetime can be increased by making the dose into the detector more spatially uniform. A single resistive grid assembly with a radial voltage gradient may replace the separate grids. A multiplicity of deflector electrodes may be located between the target and grid to enhance shaping of the electric field.

22 Claims, 12 Drawing Sheets

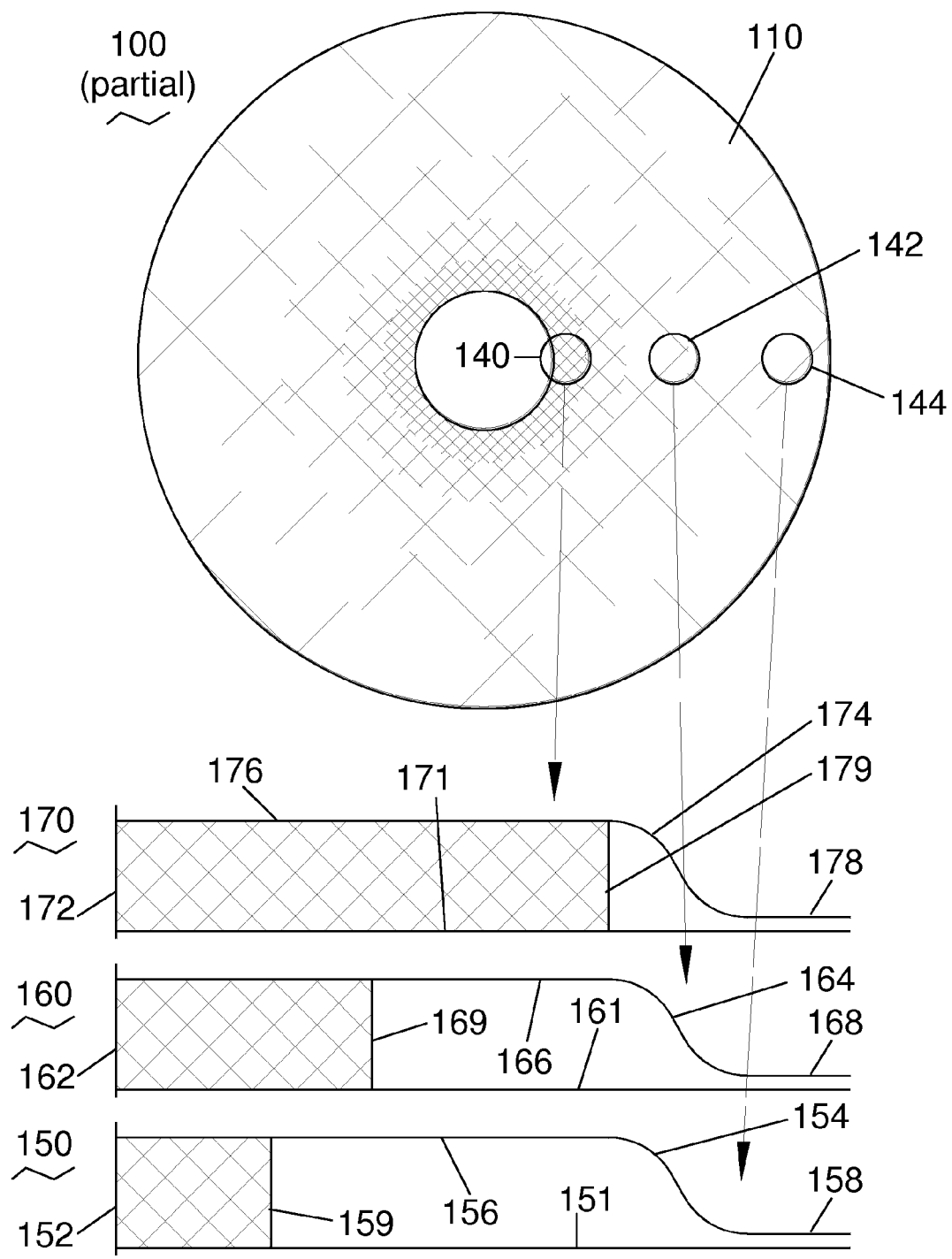
PRIOR ART FIG. 1B

DISTRIBUTED POTENTIAL CHARGED PARTICLE DETECTOR

TECHNICAL FIELD OF THE INVENTION

The present invention relates generally to focused charged particle systems and in particular to reducing damage and contamination in detectors for secondary particles.

BACKGROUND OF THE INVENTION

In charged particle systems, comprising both electron microscopes and focused ion beam systems, a column is typically used to focus a charged particle beam onto the surface of a target to be imaged and (optionally) processed using the beam. To form an image of the target, it is necessary to deflect the beam across the target surface, usually in a raster pattern. Due to the impact of the charged particle beam with the target, secondary particles are emitted and may be collected to form an imaging signal. As an example, an electron beam will stimulate the emission of secondary electrons from the target. A focused ion beam will stimulate the emission of both secondary electrons and secondary ions (usually positively-charged). A secondary particle detector is employed in these systems to generate the necessary imaging signal—these detectors may be characterized by their collection efficiency, i.e., the fraction of emitted secondary particles which are actually collected by the detector. To enhance this collection efficiency, a "collection" grid is often positioned between the target and the detector. A voltage applied to this grid creates an electric field between the target and grid to attract secondary particles, which then pass through the grid (a sparse mesh or other nearly transparent structure) and then to the detector.

Unfortunately, it is found that over time, secondary detectors may exhibit a loss in efficiency due to either damage to the detector and/or a build-up of contamination on the detector surface. This damage results from the energetic bombardment of the detector by incoming secondary particles, which can disrupt the detector material. Contamination covers the detector with a thin film such as polymerized hydrocarbons arising from the interaction of the charged particle beam with trace gases in the vacuum system—often these gases arise from the interaction of the charged particle beam with the target, and thus are difficult to avoid even in systems with very low base pressures. Typically this damage is non-uniform over the detector surface. This non-uniformity arises because the emission pattern of secondary particles from the target is concentrated in a direction upwards (following a cosine law) from the target. If the detector is an annulus surrounding the primary charged particle beam, then the majority of the collected secondary particles will strike the detector near the center. Thus, the accumulated damage and/or contamination on the detector will also be concentrated near the center. Detector lifetime is determined by the most damaged or contaminated area (even if the majority of the detector area is still functional), so when the center of the detector becomes unusable due to damage and/or contamination, the entire detector must be replaced, reconditioned, or cleaned. Thus, it would be advantageous in charged particle systems to improve the detector lifetime by making the damage and/or contamination rate more uniform over the area of a charged particle detector to improve the overall detector lifetime.

SUMMARY OF THE INVENTION

An object of the invention is to improve the lifetime of secondary particle detectors in charged particle systems.

The present invention increases the useful life of secondary particle detectors by providing a detector assembly that spreads the secondary particles more evenly over the detector, thereby reducing the damage to parts of the detector that would otherwise degrade more quickly because of the disproportionately large number of secondary particles impinging on those portions of the detector. In some embodiments, a grid positioned between the target and the detector provides a field that spreads the secondary particles more evenly over the detector. The grid can comprise multiple sections, each at a different potential, or a resistive grid can provide different potentials across a single grid section.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which:

FIG. 1B is a portion of the prior art charged particle detector from FIG. 1A, showing graphs of the detector gain as a function of the time-integral of the detector output current;

DETAILED DESCRIPTION OF PREFERRED EMBODIMENTS

The present invention provides a field that that deflects secondary charged particles before they impact on a detector to reduce the maximum current density of the charged particles impinging on the charged particle detector, thereby prolonging the useful life of the charged particle detector. By "maximum current density" is meant the highest current density on any area of the detector. The distribution of the secondary charged particles is more uniform that it would be in the absence of the provided field.

In one embodiment, the invention positions a multiplicity of secondary particle collection grids between a target and the secondary particle detector. The voltage on each grid is independently controllable in order to create an electric field between the target and the array of collection grids which deflects the secondary particles farther off-axis. This deflection of the secondary particles makes the distribution of secondary particles which reach the detector more spatially uniform that would be the case with a single collection grid. The term "secondary particle" as used herein includes backscattered particles from the primary beam.

In a second embodiment, a resistive grid is used in place of the array of grids. A voltage is applied across the resistive grid to create approximately the same electric field as was induced in the first embodiment using the separate grids.

In a third embodiment, a multiplicity of deflector electrodes is positioned between the collection grid and the target, again with the purpose of creating an electric field needed to make the secondary particle distribution at the detector more uniform.

Figure 9:
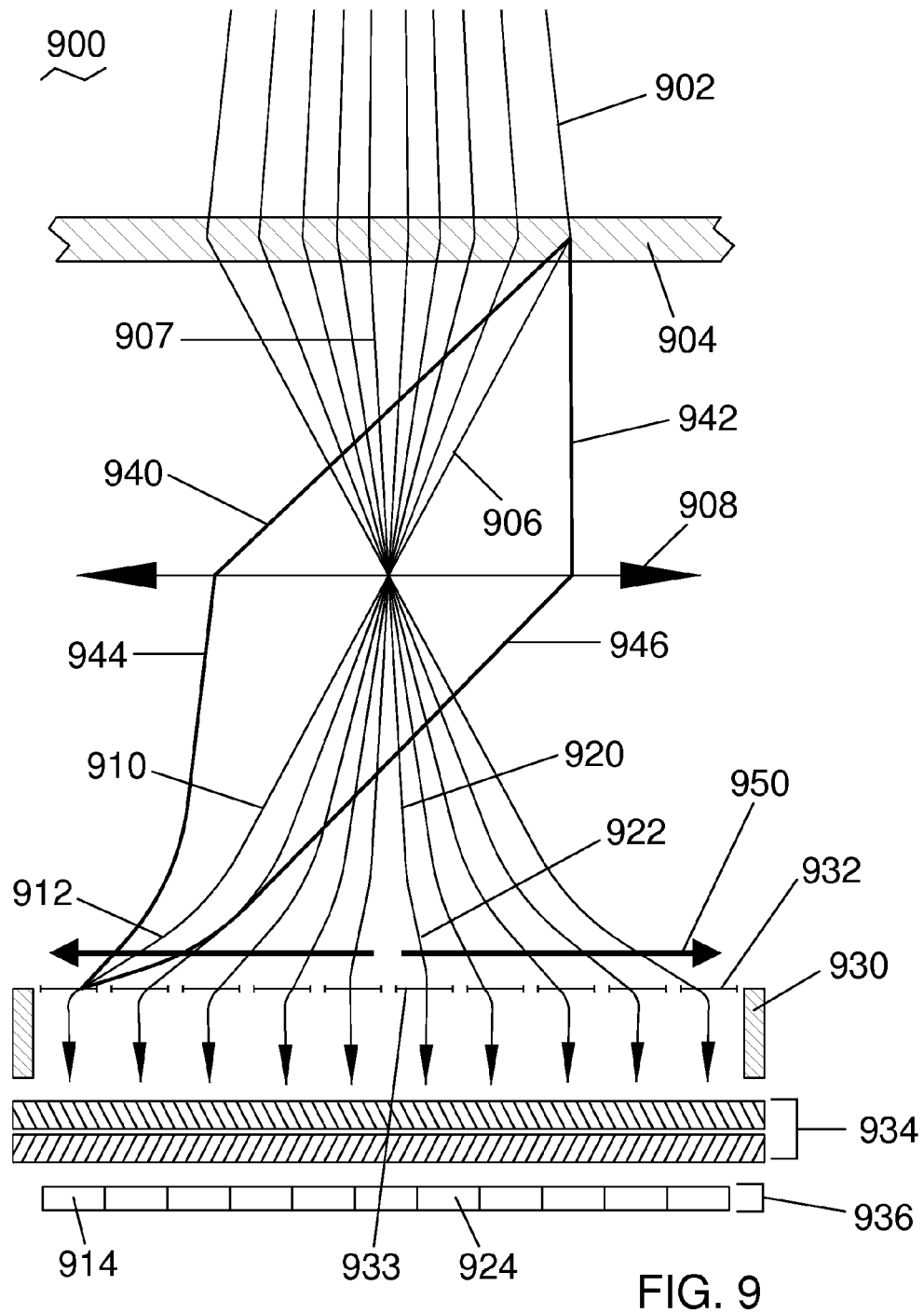
FIG. 9 shows another embodiment of the invention, with application to a transmission electron microscope (TEM)
Figure 10:
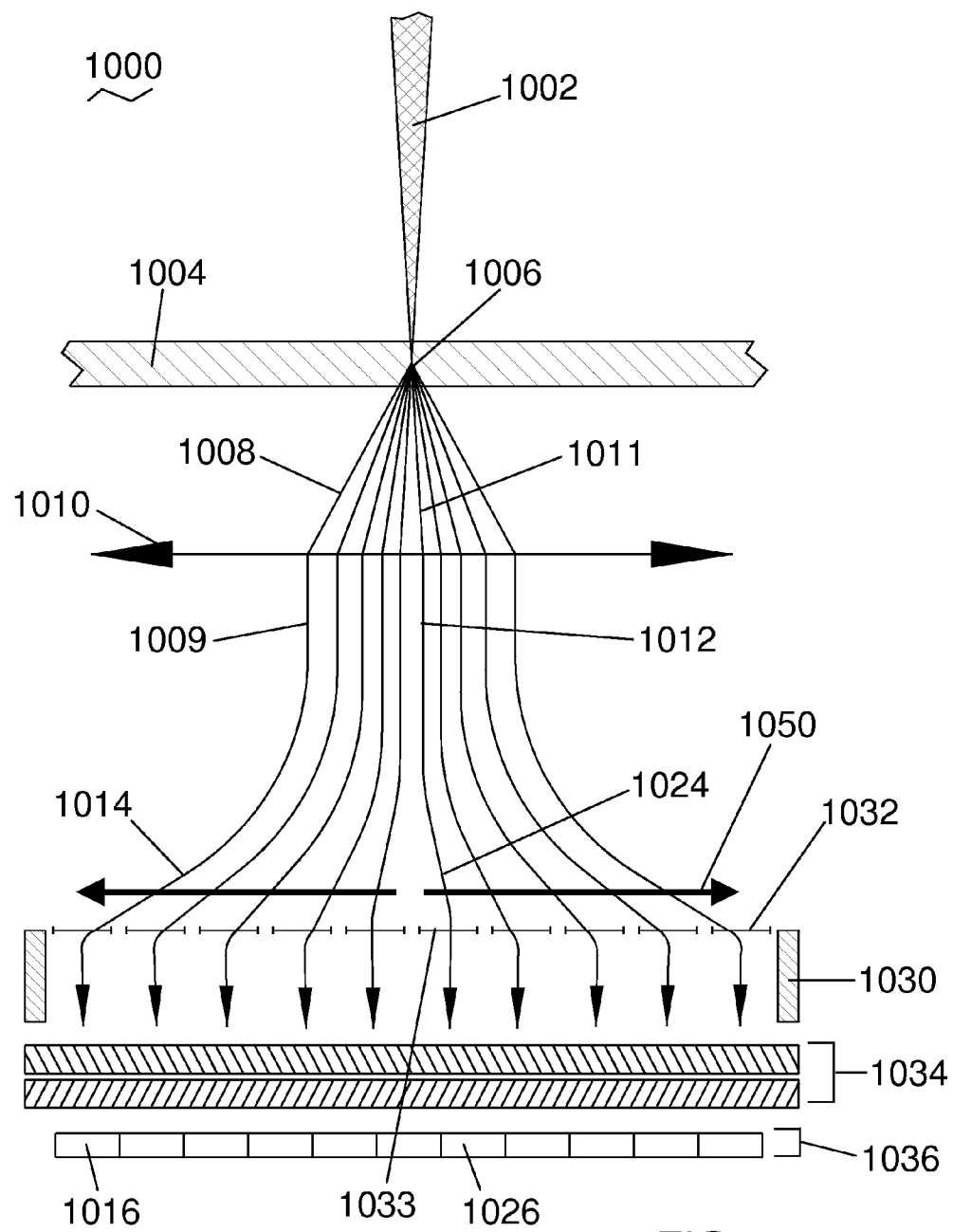
FIG. 10 shows another embodiment of the invention, with application to a scanning transmission electron microscope (STEM).

Embodiments of the present invention may also be used in cases where the detector is used in an imaging mode, as illustrated herein for a transmission electron microscope (TEM—FIG. 9) and a scanning transmission electron microscope (STEM—FIG. 10). In these applications, it is often the case that the full detector area cannot be used for imaging due to considerations in the optical designs of the columns. Thus, the particle distributions at the detector are again non-uniform (often more concentrated around the symmetry axis of the column). Embodiments of the present invention may enable more of the detector area (typically areas farther from the symmetry axis of the column) to be used for imaging, thereby increasing the detector lifetime. For these imaging applications, it may not be possible to make the signal current fully uniform at the detector since the spatial distribution of particles striking the detector conveys image information. Positional information is maintained by expanding the secondary charged particle spatial distribution, that is, maintaining the relative position of the secondary particles from the optical axis of the column. An additional benefit for imaging detectors may be an increase in the imaging resolution—this arises from the fact that spreading the imaging signal over a larger area of the detector may enable the use of a larger number of detector elements within the detector array to form the image.

A further benefit of some embodiments of the present invention is the potential for higher signal gains in cases where local saturation of the detector gain would otherwise occur. For example, it is well known that multichannel plates (MCPs) amplify the input signal current by as much as $10^6$-$10^7$—this amplification occurs within the many channels of the MCP. If a large input signal current strikes only a small area of the MCP, it is possible to saturate the local gain that region of the MCP, while other areas of the MCP (receiving lower input currents) still retain their original (higher) gains. This saturation in MCPs occurs due to "current loading" effects in which the inherent resistivity of the MCP prevents enough supply current from reaching the saturated area of the MCP to provide the normal level of signal amplification. Since the present invention spreads the input current over a larger and more uniform area of the detector, these local saturation effects should be reduced or eliminated. This corresponds to a wider range of linearity (i.e., higher gain before saturation) in the overall detector response.

Although those of ordinary skill in the art will readily recognize many alternative embodiments, especially in light of the illustrations provided herein, this detailed description is exemplary of the preferred embodiments of the present invention, the scope of which is limited only by the appended claims.

The present invention derives from the recognition that the lifetime of secondary particle detectors in charged particle systems may be adversely affected by two factors:
 1) Damage to the detector due to bombardment by secondary particles, and
 2) Contamination of the detector due to polymerization and deposition of materials on the detector arising from bombardment by secondary particles.

Typical types of secondary electron detectors comprise:
 1) Multichannel plates (MCPs)—these types of detectors have a large number of very small channels operating in parallel across the collection area of the detector. Each channel operates independently of the others, amplifying the incoming secondary particle current by factors of as much as $10^6$-$10^7$ in a process of cascade multiplication within each channel. This amplified current is then collected on one or more anodes positioned on the far side of the MCP (i.e., the opposite side from the side receiving the input signal current). Often, to avoid "ion feedback", a two-stage structure is employed in which the channels in the first stage have a different angle than those in the second-stage, thereby eliminating "line-of-sight" travel of positive ions from the exit back to the entrance of the MCP.
 2) PIN diodes—these types of detectors are essentially a diode within which the incoming secondary particle produces a cascade of electron-hole pairs. The gain of the PIN diode detector is proportional to the energy of the incoming secondary particle.
 3) Scintillator+Light Pipe+PMT—this common type of detector operates by the initial generation of light within the scintillator material (typically either a crystal or plastic) due to the impact of a secondary particle. This light is then transmitted through the light pipe to a photomultiplier tube (PMT), usually located outside the vacuum enclosure of the charged particle system comprising the secondary particle detector.

All three of these detectors have this characteristic in common: the entire detector will become unusable if any part of the detector becomes unusable. Since the rates of damage and/or contamination for each specific area of a detector are generally proportional to the integrated total dose of input signal into that specific area, it is clearly advantageous to ensure that all areas of the detector receive similar dose rates to ensure that the detector lifetime is maximized (i.e., the entire detector becomes unusable at approximately the same time). When only a small area of a detector receives a disproportionately large fraction of the overall secondary particle flux, clearly that area will be damaged and/or contaminated more quickly than would be the case if the secondary particle flux were more evenly distributed over the full collection area of the detector. In addition, for MCPs, if a small area of the MCP detector receives a disproportionately large fraction of the input signal current, local gain saturation may occur, resulting in non-linearity across the detector area.

Figure 1A:
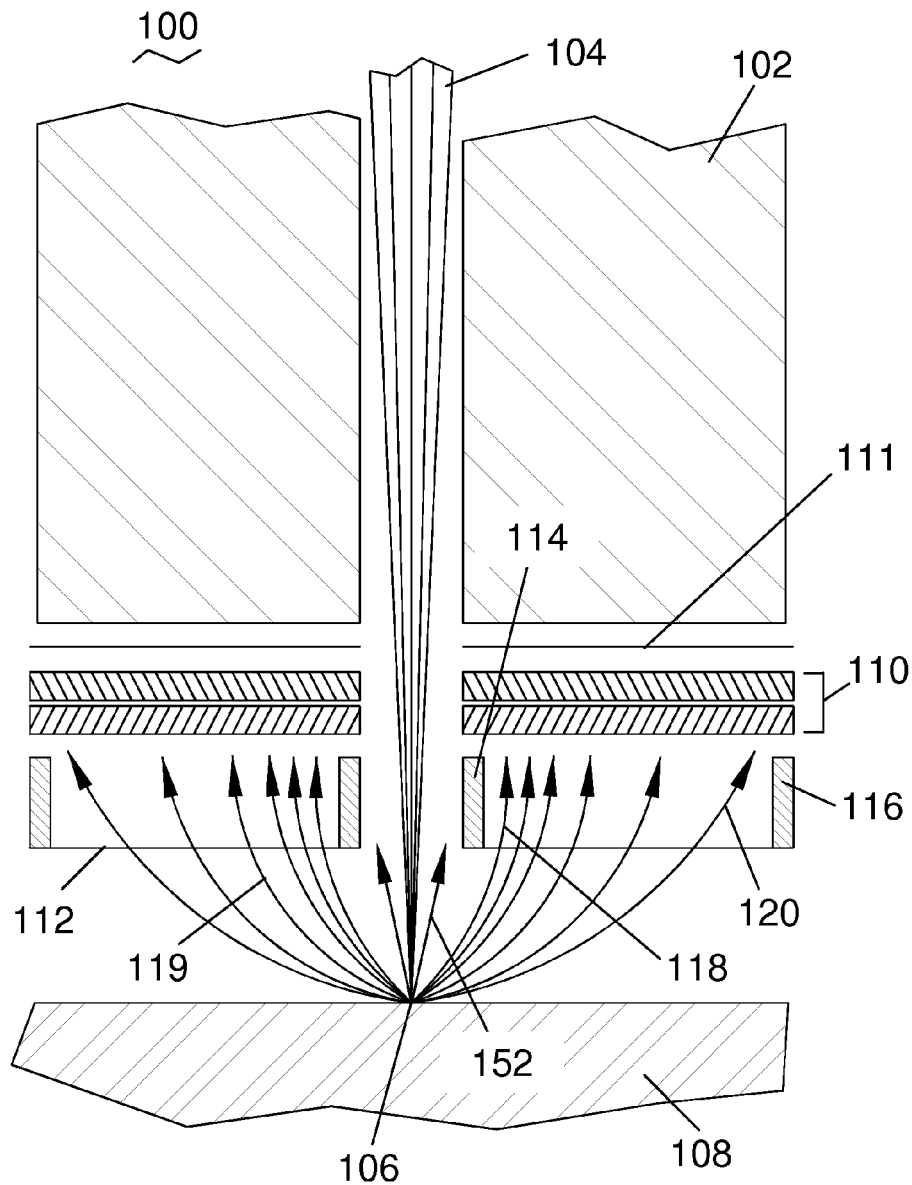
FIG. 1A shows a prior art charged particle detector in a charged particle system.

FIG. 1A shows a prior art charged particle detector 100, wherein a charged particle column 102 focuses a charged particle beam 104 onto a location 106 on the surface of a target 108. Due to the impact of the charged particle beam 104 with the target 108, secondary particles 118, 119, 120 and 152 may be emitted from the target. For the case where charged particle beam 104 is an electron beam, these secondary particles will be secondary electrons. For the case where charged particle beam 104 is a focused ion beam (FIB), both secondary electrons and secondary ions (mostly positive) may be emitted from the target 108. Generally, the emission pattern of secondary particles (in the case of a normally-incident primary beam 104), tends to follow a Lambert, or cosine, law angular distribution concentrated around an axis perpendicular to the surface of the target 108 at the point 106 of impact of the primary charged particle beam 104 with the target 108. In the prior art, an annular detector 110 (shown here as a two-stage multichannel plate) providing current gain and a collection anode 111 typically are mounted on the bottom of the charged particle column 102 as illustrated in FIG. 1. To enhance collection of secondary particles, a collection grid 112, supported by an inner ring 114 and an outer ring 116, may be employed. A single voltage is applied to the collection grid 112 to draw secondary particles towards the grid 112 which is largely transparent to secondary particles that mostly pass through grid 112 and are subsequently collected by detector 110 and collection anode 111. Detector 110 may comprise a multi-channel plate (MCP), in which case the signal current is collected on an anode 111, as shown. Alternatively, detector 110 may comprise a PIN diode detector, a scintillator connected to a light pipe and photomultiplier tube (see FIG. 8), or possibly other types of charged particle detector—in these cases, anode 111 may not be necessary, since the signal is derived by the detector 110 itself. Details of the detector 110 and anode design 111 are well-known in the art.

Due to the cosine emission pattern of the secondary particles, some particles 152 will be emitted too close to the axis of column 102 to be collected by grid 112, and thus will pass up the bore of the charged particle column 102, and will not be detected. Those secondary particles 118 which were emitted from target 108 at slightly larger angles than particles 152 pass through grid 112 to be collected near the center of detector 110, as shown. A smaller portion of secondary particles 120 which are emitted at much larger angles pass through collection grid 112 much farther off-axis and are collected near the outer edge of detector 110. It is well known in the art that many types of detectors, such as both multichannel plates, PIN diodes, and scintillators, demonstrate damage mechanisms which are functions of the total integrated signal current into each area of the detector. Thus, for an MCP detector 110, the region near the central hole (required to allow passage of the primary beam 104 to the target 108) will be damaged before the outer regions of the MCP 110. A similar situation applies to PIN diodes and scintillators. In addition to damage, detectors may also become contaminated with polymerized hydrocarbons from a poor vacuum between the target and detector—note that this may occur due to beam-target interactions, even in cases where the base vacuum level would have been adequate to prevent contamination. In either case, the lifetime of an entire detector is determined by when a certain level of damage and/or contamination has occurred anywhere on the detector, even if the remainder of the detector is not yet damaged and/or contaminated to an unusable degree. The lifetime of detector 110 in the prior art configuration illustrated in FIG. 1 may be substantially reduced compared with the case where secondary particles were more uniformly distributed over the detector 110 surface.

FIG. 1B shows a portion of the prior art charged particle detector 100 from FIG. 1A. Detector 110 is shown in a view looking up at the input signal collection surface (lower surface of detector 110 in FIG. 1A). The concentration of the input signal current near the center of detector 110 is illustrated using progressively-heavier cross-hatched shading from the edge to the center of detector 110. Three regions 140, 142, and 144, of the detector 110 at the center, middle, and edge, respectively, are indicated by the circles with arrows to the corresponding graphs, below.

Starting at the inner edge 140 of the central hole in detector 110 (where ring 114 in FIG. 1A is attached), graph 170 is a plot of the local signal gain 172 as a function of the time-integral 171 of the output (i.e., amplified) signal current from region 140 over the lifetime of detector 110. As shown, gain curve 174 has an initial high level 176, which is maintained over a certain total time-integral of output signal current (i.e., to a certain total output signal charge), then gain curve 174 drops to a lower level 178 at the right of graph 170. Because the input signal current at region 140 is relatively high, the cross-hatched shading representing the time-integral of the output signal current extends to line 179, nearly at the point at which the gain curve 174 will start to drop. Thus, the useful lifetime of detector 110 is nearly over.

At the middle region 142 in detector 110, the input signal current is at a medium level. Graph 160 is a plot of the local signal gain 162 as a function of the time-integral 161 of the output signal current from region 142 over the lifetime of detector 110. As shown, gain curve 164 has an initial high level 166, which is maintained over a certain total time-integral of output signal current, then gain curve 164 drops to a lower level 168 at the right of graph 160. The key difference from graph 170 is that the cross-hatched shading extends only to line 169, a substantial distance from the point at which the gain 164 will drop—thus, at region 142, detector 110 still has a substantial useful lifetime remaining. Of course, since the detector lifetime depends on all areas being usable, this localized residual lifetime of region 142 cannot be used due to region 140 having essentially no residual lifetime.

Similar considerations apply at the outer region 144 of detector 110—where graph 150 is a plot of the local signal gain 152 as a function of the time-integral 151 of the output signal current from region 144 over the lifetime of detector 110. As shown, the gain curve 154 has an initial high level 156, which is maintained over a certain total time-integral of output signal current, then gain curve 154 drops to a lower level 158 at the right of graph 150. Because the input signal current at region 144 is relatively low compared to the input signal currents at regions 142 and 140, the edge 159 of the cross-hatched area is farther to the left, showing that most of the detector lifetime at region 144 at the edge of detector 110 has not been used by the time area 140 is close to becoming unusable. Comparison of graphs 150, 160, and 170 illustrates how the lifetime of detector 110 may be substantially reduced when the input signal currents between regions 140, 142 and 144 are unequal.

Figure 2A:
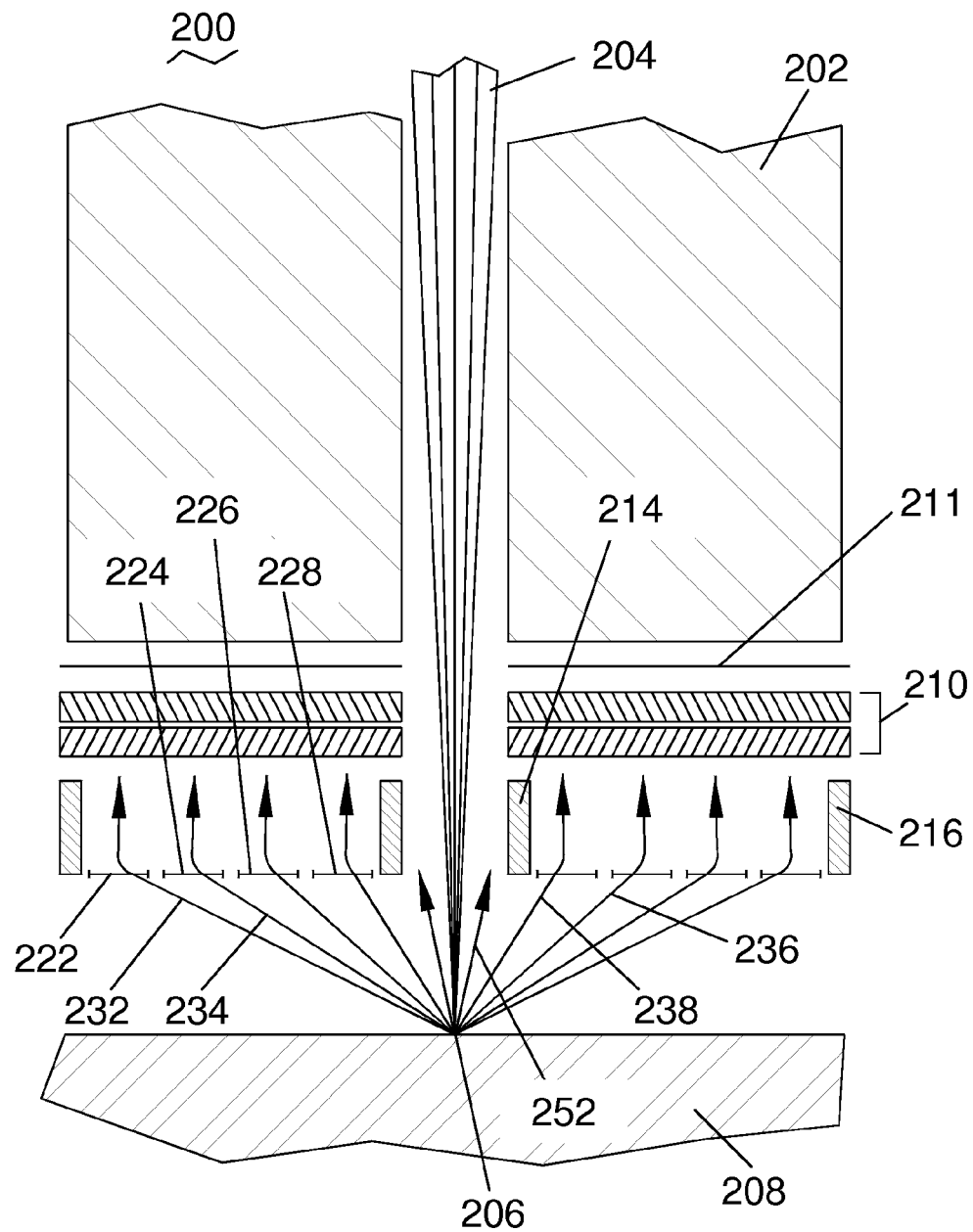
FIG. 2A shows a first embodiment of the invention, comprising a multiplicity of annular collection grids.
Figure 6:
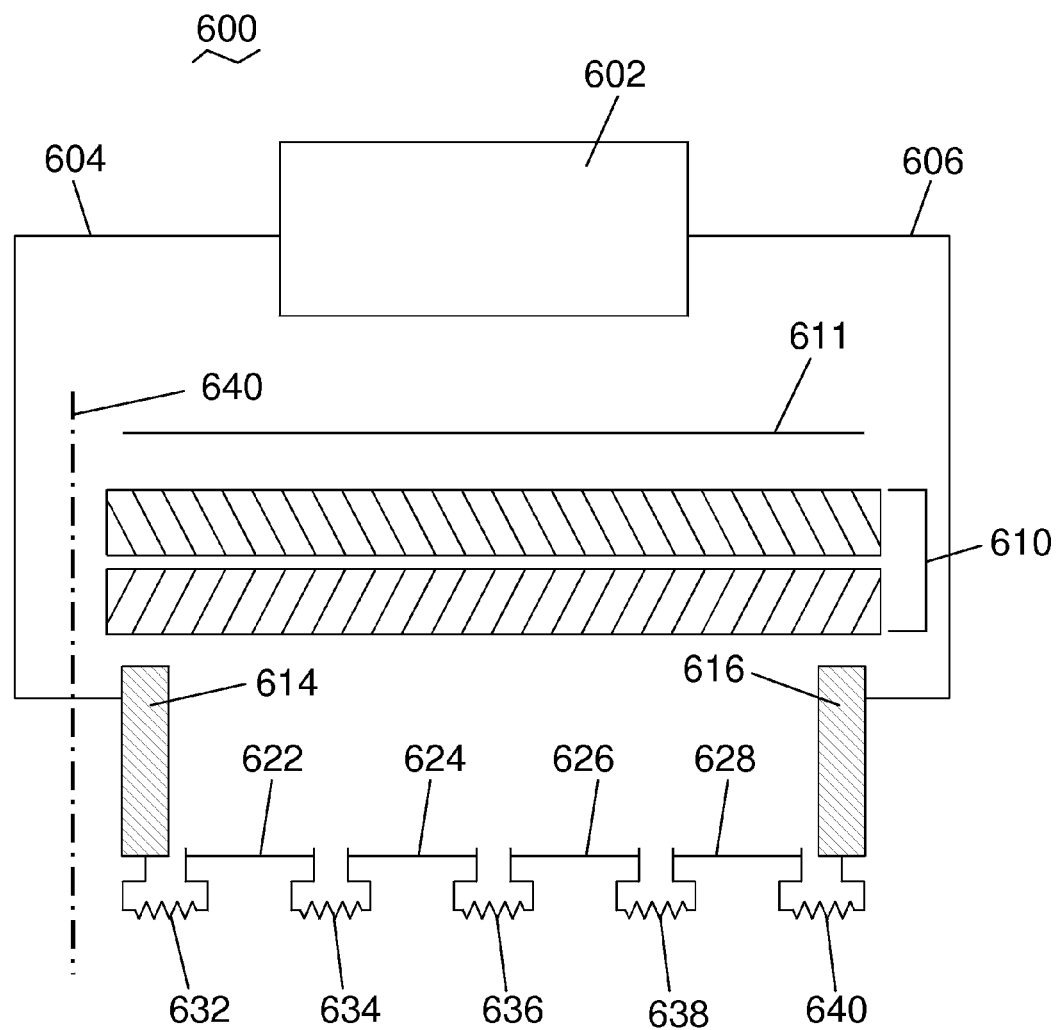
FIG. 6 shows an electrical schematic diagram for a first biasing circuit for a multiplicity of grids.
Figure 7:
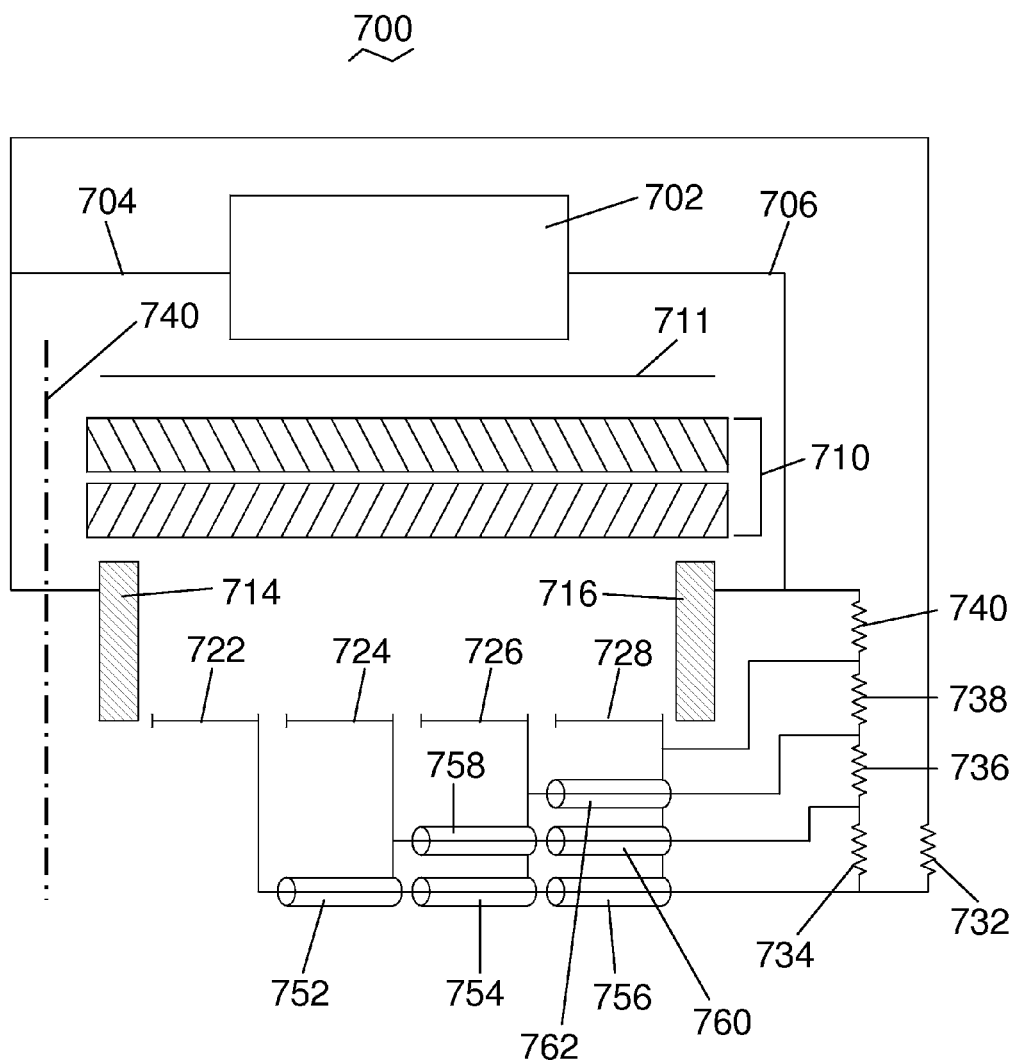
FIG. 7 shows an electrical schematic diagram for a second biasing circuit for a multiplicity of grids.

FIG. 2A shows a first embodiment 200 of the invention, comprising a multiplicity of annular collection grids 222, 224, 226, and 228, supported by an inner ring 214 and an outer ring 216. The exact number of grids would be determined by the degree of electric field uniformity desired. The number of grids is preferably between 2 and about 20, more preferably between 2 and 8, and most preferably between 3 and 5. A charged particle column 202 focuses a charged particle beam 204 onto a location 206 on the surface of a target 208. Due to the impact of the beam 204 with the target 208, secondary particles may be emitted from the target 208. FIGS. 6 and 7, below, discuss two electrical circuits which may be used to apply differing bias voltages to the inner ring 214, annular grids 222, 224, 226, and 228, as well as the outer ring 216. The bias voltages are set to create an electric field which pulls secondary particles away from the symmetry axis of the column 202, detector 210 and collection anode 211. Thus, under the influence of the electric field, secondary particles 232 pass through grid 222, secondary particles 234 pass through grid 224, secondary particles 236 pass through grid 226, and secondary particles 238 pass through grid 228. Secondary particles 252 which are emitted near the symmetry axis are not collected. Comparison of FIGS. 1A and 2A shows that the radial distribution of secondary particles entering the grids 222, 224, 226, and 228, is now less concentrated near the symmetry axis of detector 210 and collection anode 211. The net result is that now a larger fraction of the collection area of detector 210 is utilized effectively in providing signal gain, potentially reducing or eliminating signal gain saturation effects as discussed above. Because the distribution of current into detector 210 is more uniform, the damage and/or contamination mechanisms discussed in FIG. 1A will also occur more uniformly over the entire collection area of detector 210. The lifetime of detector 210 with respect to damage and/or contamination should thus be increased, reducing maintenance costs for the system comprising this detector system 200.

Figure 2B:
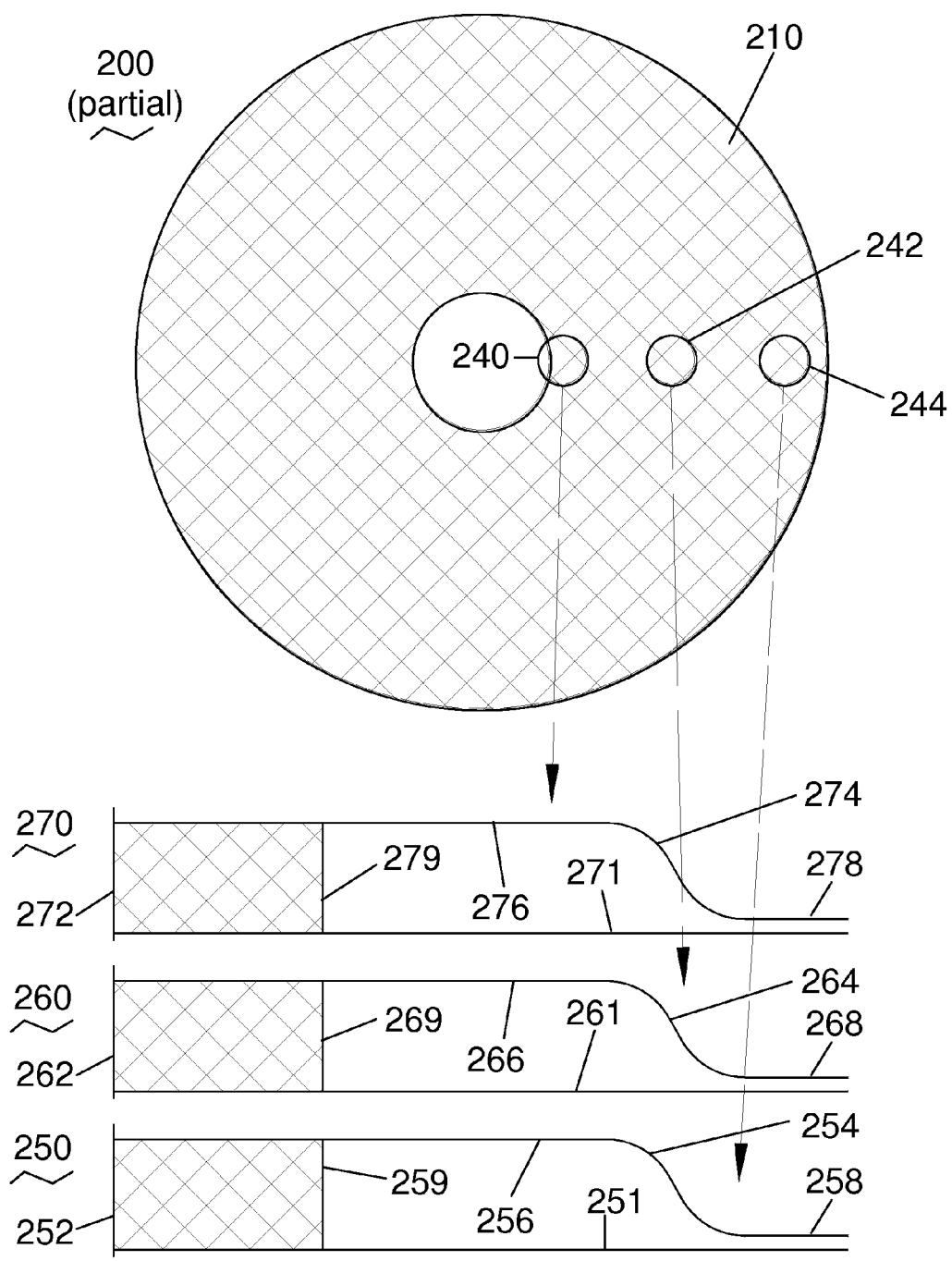
FIG. 2B is a portion of the first embodiment of the invention from FIG. 1A, showing graphs of the detector gain as a function of the time-integral of the detector output current.

FIG. 2B shows a portion of the charged particle detector 200 of a first embodiment of the present invention from FIG. 2A. Detector 210 is shown in a view looking up at the input signal collection surface (lower surface of detector 210 in FIG. 2A). The relative uniformity of the input signal current across the collection area of detector 210 enabled by the present invention is illustrated using uniform cross-hatched shading across the full collection area of detector 110 (compare with FIG. 1B). Three regions 240, 242, and 244, of the detector 210 at the center, middle and edge, respectively, are highlighted.

Starting at the inner edge 240 of the central hole in detector 210 (where ring 214 in FIG. 2A is attached), graph 270 is a plot of the local signal gain 272 as a function of the time-integral 271 of the output (i.e., amplified) signal current from region 240 over the lifetime of detector 210. As shown, gain curve 274 has an initial high level 276, which is maintained over a certain total time-integral of output signal current (i.e., to a certain total output signal charge), then gain curve 274 drops to a lower level 278 at the right of graph 270. Because the input signal current at region 240 is lower than for the comparable graph 170 in FIG. 1B, the cross-hatched shading representing the time-integral of the output signal current extends to line 279, which is only about half of the way to the point at which the gain curve 274 will start to drop. Thus, about half of the useful lifetime of detector 210 remains, in contrast with the case in FIG. 1B.

At the middle region 242 in detector 210, the input signal current is at roughly the same level as for area 240. Graph 260 is a plot of the local signal gain 262 as a function of the time-integral 261 of the output signal current from region 242 over the lifetime of detector 210. As shown, gain curve 264 has an initial high level 266, which is maintained over a certain total time-integral of output signal current, then gain curve 264 drops to a lower level 268 at the right of graph 260. Note that the cross-hatched shading extends to line 269, at roughly the same position along axis 261 as line 279 is along axis 271 in graph 270—thus, at region 242, detector 210 still has about the same useful lifetime remaining as at region 240.

Similar considerations apply at the outer region 244 of detector 210—where graph 250 is a plot of the local signal gain 252 as a function of the time-integral 251 of the output (signal current from region 244 over the lifetime of the detector 210. As shown, gain curve 254 has an initial high level 256, which is maintained over a certain total time-integral of output signal current, then gain curve 254 drops to a lower level 258 at the right of graph 250. Because the input signal current at region 244 is similar to the input signal currents at regions 240 and 242, the edge 259 of the cross-hatched area is roughly at the same location along axis 251 as lines 269 and 279 are along axes 261 and 271, respectively. Comparison of the cross-hatched areas in graphs 250, 260, and 270 illustrates how the lifetime of detector 210 may be substantially increased when the input signal currents between regions 240, 242 and 244 are equalized by the present invention.

Figure 3:
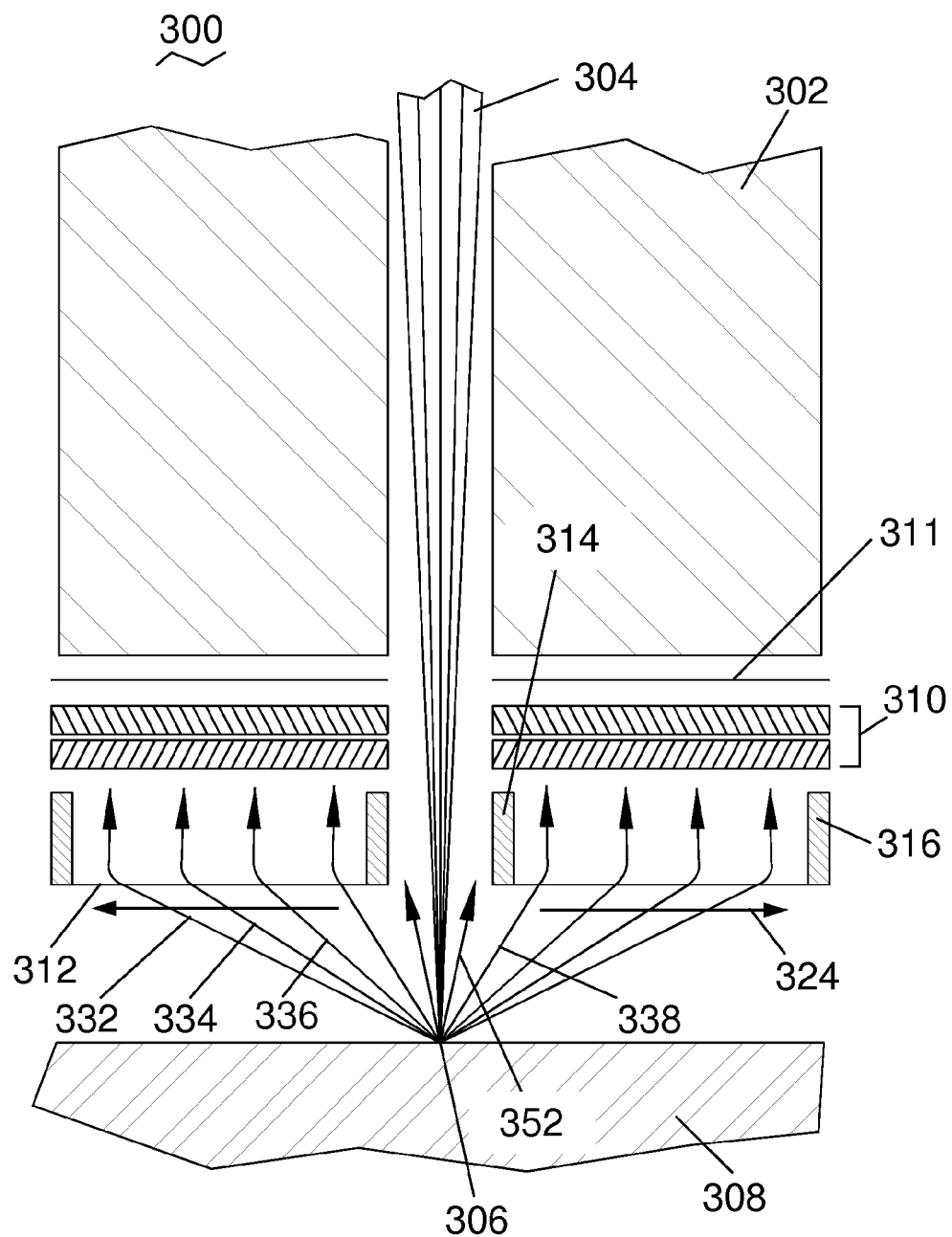
FIG. 3 shows a second embodiment of the invention, comprising a single resistive annular collection grid.

FIG. 3 shows a second embodiment 300 of the invention, comprising a single resistive annular collection grid 312, supported by an inner ring 314 and an outer ring 316. A charged particle column 302 focuses a charged particle beam 304 onto a location 306 on the surface of a target 308. As in FIGS. 1 and 2, the impact of the charged particle beam 304 with the target 308 may induce the emission of secondary particles. The first embodiment in FIG. 2 utilized a series of concentric annular grids to produce an electric field to draw secondary particles away from the axis and out to regions of the detector which would normally receive lower secondary particle currents. The second embodiment of the present invention illustrated in FIG. 3 utilizes a resistive grid 312 upon which a radial voltage gradient is applied arising from a voltage difference between the inner ring 314 and the outer ring 316. In the case of secondary electron collection by detector 310, the radial force vector 324 would correspond to a more positive voltage on the outer ring 316 and a less positive voltage on the inner ring 314. In the case of (positive) secondary ion collection by detector 310, the relative voltages on the inner ring 314 and outer ring 316 would be reversed. Since some portion of the secondary particles (either electrons or ions) will strike the resistive grid 312, it is necessary to ensure that the resulting current in grid 312 does not affect the radial voltage gradient desired in grid 312 to establish the correct electric field needed to equalize the radial distribution of secondary particles reaching the detector 310 and collection anode 311. This is a similar situation to that found in photomultiplier tubes (PMTs), where typically the current in the resistor chain used to generate the voltages on the dynodes is specified to be at least ten times higher than the largest internal currents within the PMT. When this condition is not met, the voltage distribution within the resistive grid 312 may not produce the desired distribution of trajectories 332, 334, 336, and 338 passing through resistive grid 312 shown in FIG. 3. Detector 310 (shown here as an annular two-stage multichannel plate providing current gain) and the collection anode 311 typically are mounted on the bottom of the charged particle column 302. As in FIGS. 1 and 2, a small portion 352 of secondary particles emitted near the symmetry axis of the column 302, detector 310, and collection anode 311, will pass up the bore of column 302 and will not be detected.

Figure 4:
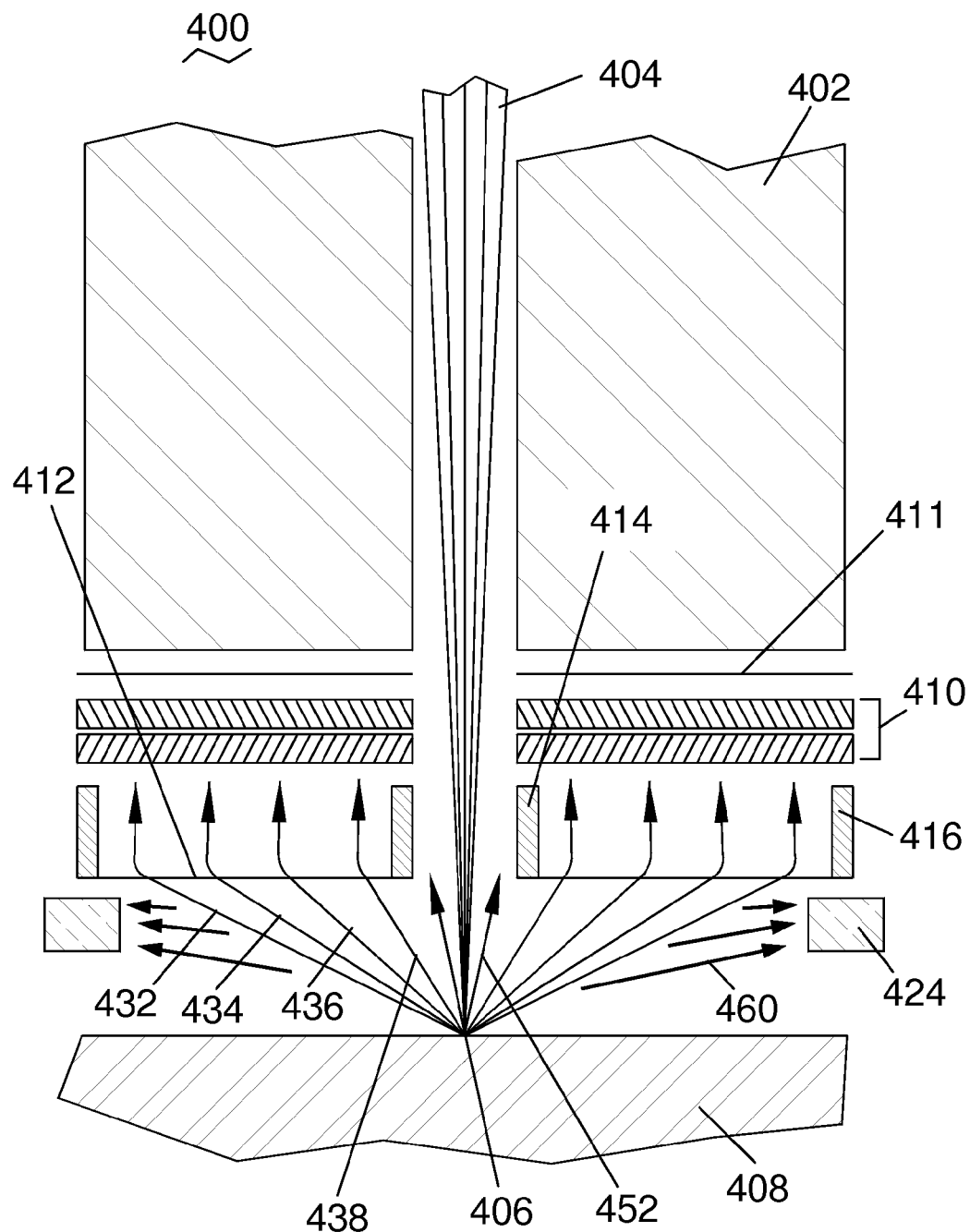
FIG. 4 shows a third embodiment of the invention, comprising a multiplicity of deflector electrodes for attracting charged particles.

FIG. 4 shows a third embodiment 400 of the invention, comprising a multiplicity of deflector electrodes 424 for attracting secondary particles away from the symmetry axis of the column 404, detector 410, and collection anode 411. A charged particle column 402 focuses a charged particle beam 404 onto a location 406 on the surface of a target 408. As in FIGS. 1 through 3, the impact of the charged particle beam 404 with the target 408 may induce the emission of secondary particles which may be secondary electrons and/or secondary ions. A collection grid 412 is supported by an inner ring 414 and an outer ring 416. In one version of the third embodiment, the inner ring 414, grid 412 and outer ring 416 may have the same voltage—in this case, the deflector electrodes 424 generate a more uniform distribution of secondary particles at detector 510 and collection anode 511. In another version of the third embodiment, the multiplicity of grids of the first embodiment may be substituted for conductive grid 412, thereby enabling the generation of a radial electric field by means of both deflector electrodes 424 and a multiplicity of concentric annular collection grids such as grids 222, 224, 226, and 228 in FIG. 2. In still another version of the third embodiment, the resistive collection grid 312 of the second embodiment (see FIG. 3) may be substituted for conductive grid 412, thereby enabling the generation of a radial electric field by means of both the added deflector electrodes 424 and the resistive grid 312. In the case of secondary electron collection, deflector electrodes 424 would have a positive bias applied to attract the secondary electrons radially outwards as shown by force vectors 460, and hence through grid 412 and onto detector 410 at a larger radius than would otherwise have been the case. For (positive) secondary ions, a negative bias would be applied to deflector electrodes 424, again making force vectors 460 point radially outwards. Secondary particles 452 which are emitted near the symmetry axis are not collected. Detector 410 (shown here as an annular two-stage multichannel plate providing current gain) and the collection anode 411 typically are mounted on the bottom of the charged particle column 402.

Figure 5:
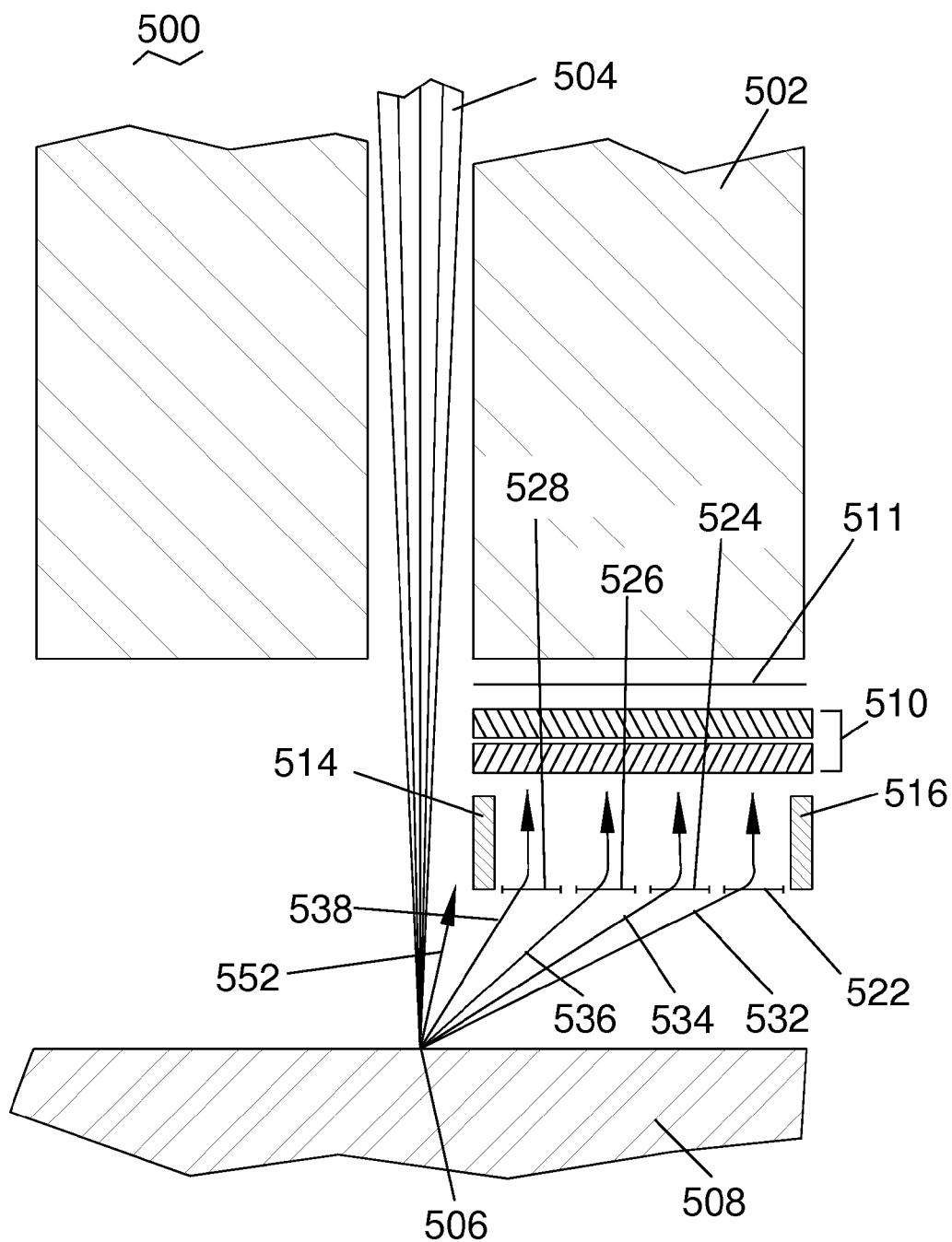
FIG. 5 shows a fourth embodiment of the invention, comprising an off-axis charged particle detector with a multiplicity of collection grids.

FIG. 5 shows a fourth embodiment 500 of the invention, comprising an off-axis charged particle detector with a multiplicity of collection grids 522, 524, 526, and 528, supported by an inner electrode 514 and an outer electrode 516—details of the mechanical support for grids 522, 524, 526, and 528 are not part of the present invention and are not shown. Note that there is no circular symmetry assumed or required for this fourth embodiment. A charged particle column 502 focuses a charged particle beam 504 onto a location 506 on the surface of a target 508. As in FIGS. 1 through 4, due to the impact of the beam 504 with the target 508, secondary particles may be emitted from the target 508. The differing bias voltages on the grids 522, 524, 526, and 528, are adjusted to create an electric field which pulls secondary particles away from the symmetry axis of the column 502 (although the detector has no required symmetry for this embodiment, the column 502 will still typically retain circular symmetry with respect to the beam-forming optics)—toward the right of FIG. 5, in this example. Thus, under the influence of the electric field, secondary particles 532 pass through grid 522, secondary particles 534 pass through grid 524, secondary particles 536 pass through grid 526, and secondary particles 538 pass through grid 528. The same considerations apply to this non-circularly symmetric detector system as applied in FIGS. 2 through 4 for the circularly-symmetric detectors of the first three embodiments—the voltages on grids 522, 524, 526, and 528 may be adjusted to spread out the distribution of secondary particles entering detector 510 and collection anode 511, thereby making any damage and/or contamination mechanisms also more uniform. Secondary particles 552 which are emitted near the symmetry axis are not collected. Detector 510 (shown here as a two-stage multichannel plate providing current gain) and the collection anode 511 typically are mounted on the bottom of the charged particle column 502.

FIG. 6 shows an electrical schematic diagram 600 for a first biasing circuit for a multiplicity of grids 622, 624, 626, and 628, supported by an inner electrode 614 (corresponding to inner ring 214 in FIG. 2 or inner electrode 514 in FIG. 5) and an outer electrode 616 (corresponding to outer ring 216 in FIG. 2 or outer electrode 516 in FIG. 5). Circuit 600 is applicable to the detector systems illustrated in FIGS. 2 and 5, and would also be applicable if the detector system in FIG. 4 were combined with the segmented grid structures from FIG. 2. Detector 610 may represent one side of an annular detector such as detector 210 in FIG. 2, or an off-axis detector such as detector 510 in FIG. 5. In either case, the symmetry axis 640 represents the optical axis for the charged particle column generating the secondary particles entering detector 610 and collection anode 611. A dc power supply 602 is connected through a first wire 604 to electrode 614 and through a second wire 606 to electrode 616. The voltage bias connections for the detector 610 and collection anode 611 are not part of the present invention and are not shown. The collection grid assembly comprises four grids 622, 624, 626, and 628, connected in series between electrode 614 and electrode 616 by resistors 632, 634, 636, 638 and 640. The exact number of grids would be determined by the degree of electric field uniformity desired and is not part of the present invention. The same considerations which were discussed in FIG. 3 apply here—it is preferable to ensure that the current flowing from dc power supply 602 through electrodes 614 and 616, grids 622, 624, 626, and 628, and resistors 632, 634, 636, 638, and 640 is substantially higher (typically ten times) than any anticipated secondary particle currents which might strike any of the grids 622, 624, 626, and 628 to ensure that there is no "current loading", causing unwanted deviations in the electric field distribution between the target (not shown) and detector 610. A potential problem with circuit 600 is the requirement that the resistors 634, 636, and 638 (but not necessarily resistors 632 and 640) be mounted between the successive grids to which they attach—this may be undesirable since resistors 634, 636 and 638 would then be exposed to a portion of the secondary particle flux from the target. This may cause charging of the exterior surfaces of the resistors which could perturb the desired electric field distribution. It is also possible that the secondary particle flux could damage the resistors, causing incorrect resistance values or even shorts between neighboring collector grids.

FIG. 7 shows an electrical schematic diagram 700 for a second biasing circuit for a multiplicity of grids 722, 724, 726, and 728, supported by an inner electrode 714 (corresponding to inner ring 214 in FIG. 2) and an outer electrode 716 (corresponding to outer ring 216 in FIG. 2). Circuit 700 is applicable to the detector system illustrated in FIG. 2, and would also be applicable if the detector system in FIG. 4 were combined with the segmented grid structures from FIG. 2. The off-axis detector system illustrated in FIG. 5 may not need circuit 700 since a non-circularly symmetric detector system has room for the grading resistors without the need for the shielded cable configuration illustrated here. Detector 710 may represent one side of an annular detector such as detector 210 in FIG. 2. The symmetry axis 740 represents the optical axis for the charged particle column generating the secondary particles entering detector 710 and collection anode 711. A dc power supply 702 is connected through a first wire 704 to electrode 714 and through a second wire 706 to electrode 716. The voltage bias connections for the detector 710 and collection anode 711 are not part of the present invention and are not shown. The collection grid assembly comprises four grids 722, 724, 726, and 728, connected in series between electrode 714 and electrode 716 by resistors 732, 734, 736, 738 and 740. The exact number of grids would be determined by the degree of electric field uniformity desired and is not part of the present invention. Note that electrically, FIG. 7 is the same as FIG. 6—the difference is the physical locations for the five voltage divider resistors 732, 734, 736, 738, and 740 and the addition of coaxial shields 752, 754, 756, 758, 760, and 762. As discussed in FIG. 6, it may be problematic to locate the voltage divider resistors between the successive grids in the grid assembly. FIG. 7 illustrates an alternative architecture in which the resistors 732, 734, 736, 738, and 740 may be located outside the grid assembly, thereby avoiding the problems discussed in FIG. 6. However, simply connecting unshielded wires to each of the grids would present a new problem—since these wires necessarily must extend outwards from each annular grid, there will be overlaps between the wires from inner annular grids (such as 722, 724 and 726) and all the annular grids which are outside of the particular annular grid being connected to (such as grids 724, 726, and 728 for grid 722). One potential solution to this problem is illustrated here—the wire connecting to the inner annular grid 722 passes through a series of coaxial shields 752, 754, and 756, and then connects to resistors 732 and 734 in the voltage divider comprising resistors 732, 734, 736, 738 and 740, connected between the output wires 704 and 706 of dc power supply 702. Similarly, the wire connecting to annular grid 724 passes through coaxial shields 758 and 760, and then connects to resistors 734 and 736 in the voltage divider. In the same way, the wire from grid 726 passes through coaxial shield 762 and then connects to resistors 736 and 738 in the voltage divider. The wire connecting to the outer annular grid 728 can directly connect to resistors 738 and 740 in the voltage divider. The electrical connection between annular grid 722 and inner ring 714 is completed outside through resistor 732 as shown. All of the shields 752, 754, 756, 758, 760, and 762 represent essentially short sections of coaxial cable. The outer conductors of each shield are electrically (and, optionally, also mechanically) connected to the respective grids (e.g., shield 752 connected to grid 724) so that as each wire passes across an annular grid, there is no electric field induced by the center wire which is, of course, at a different voltage since each grid voltage has been set to a desired value for optimum charged particle collection. The short sections of wire between successive shields (e.g., between shields 752 and 754) will probably need to be stripped of the coaxial cable insulation (thus leaving a short section of the center wire exposed, e.g., the wire from grid 722 being exposed between shields 752 and 754) to avoid possible charging effects which might occur due to secondary particles collecting on exposed insulation.

Figure 8:
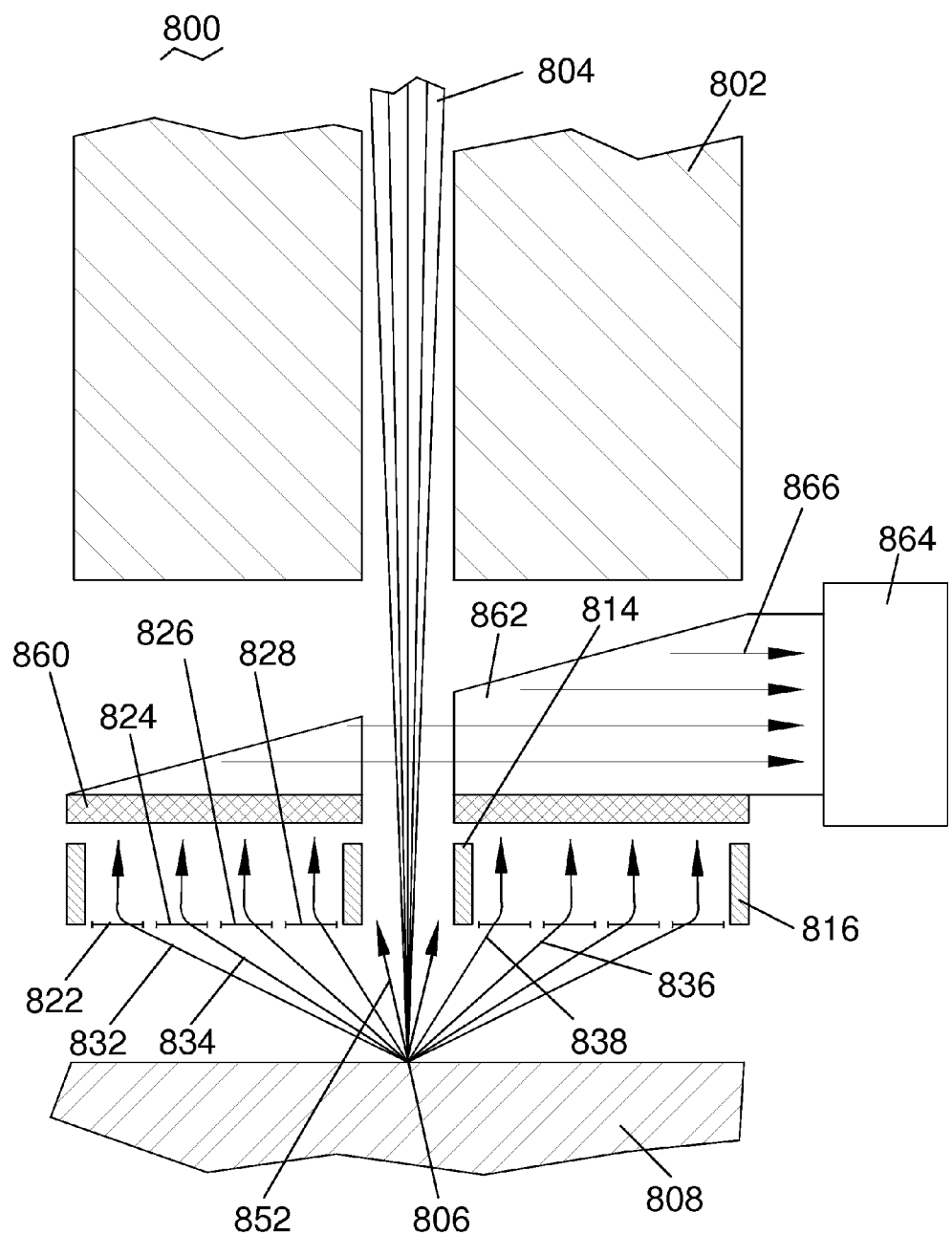
FIG. 8 shows another version of a first embodiment of the invention, comprising a scintillator, light pipe, and photomultiplier.

FIG. 8 shows a version 800 of a first embodiment of the invention, comprising a scintillator 860, light pipe 862 and photomultiplier 864, as well as a multiplicity of annular collection grids 822, 824, 826, and 828, supported by an inner ring 814 and an outer ring 816—details of the mechanical support for grids 822, 824, 826, and 828 are not part of the present invention and are not shown. A charged particle column 802 focuses a charged particle beam 804 onto a location 806 on the surface of a target 808. FIGS. 6 and 7, above, discuss two electrical circuits which may be used to apply differing bias voltages to the inner ring 814, annular grids 822, 824, 826, and 828, as well as the outer ring 816. Secondary particles 832 pass through grid 822, secondary particles 834 pass through grid 824, secondary particles 836 pass through grid 826, and secondary particles 838 pass through grid 828. The key difference in FIG. 8 relative to FIG. 2 is the substitution of a scintillator 860, light pipe 862, and photomultiplier 864 in place of the multichannel plate (MCP) detector 210 and collection anode 211 shown in FIG. 2. Like multichannel plates, scintillators also exhibit long-term damage resulting from changes in the scintillator molecular or crystal structure as a result of bombardment by charged particles. Scintillators may also become contaminated by polymerized hydrocarbons, etc. Thus, the same damage and/or contamination issues apply here as were discussed above. Scintillator 860 emits light 866 when bombarded by energetic charged particles 832, 834, 836, and 838. Light 866 passes through, and undergoes total internal reflection at the walls of, light pipe 862, then passing into photomultiplier 864. Secondary particles 852 which are emitted near the symmetry axis are not collected.

A number of combinations of different detector types and grid geometries have been illustrated in FIGS. 2 through 5, and 8. Table I lists a number of detector system configurations—other detector types and electrical biasing circuits are also possible within the scope of the present invention

TABLE I

Different detector system configurations and the corresponding detectors and electrical connections.

| Detector System Configuration | Types of Detectors | | | Electrical Connections | |
|---|---|---|---|---|---|
| | MCP | PIN Diode | Scintillator + PMT | FIG. 6 | FIG. 7 |
| Embodiment 1 - Concentric Annular Grids | Yes | Yes | Yes | Yes | Yes |
| Embodiment 2 - Annular Resistive Grid | Yes | Yes | Yes | Yes | Yes |
| Embodiment 3 - Added Deflector Electrodes | Yes | Yes | Yes | Yes | Yes |
| Embodiments 1 + 3 - Annular Grids + Deflector Electrodes | Yes | Yes | Yes | Yes | Yes |
| Embodiments 2 + 3 - Resistive Grid + Deflector Electrodes | Yes | Yes | Yes | Yes | Yes |
| Embodiment 1 - Multiplicity of Grids (No circular Symmetry) | Yes | Yes | Yes | Yes | Probably Not Needed |
| Embodiment 2 - Resistive Grid (No circular Symmetry) | Yes | Yes | Yes | Yes | Probably Not Needed |
| Embodiment 3 - Added Deflector Electrodes (No circular Symmetry) | Yes | Yes | Yes | Yes | Probably Not Needed |
| Embodiments 1 + 3 - Grids + Deflector Electrodes (No Circular Symmetry) | Yes | Yes | Yes | Yes | Probably Not Needed |
| Embodiments 2 + 3 - Resistive Grid + Deflector Electrodes (No Circular Symmetry) | Yes | Yes | Yes | Yes | Probably Not Needed |

The various embodiments of the present invention discussed in FIGS. 2 through 5 apply to non-imaging detectors, i.e., where the imaging signal arriving at the detector and then conveyed to the collection anode (if the detector is a multichannel plate) carries no positional information. The entire detector in these examples generated a single imaging signal, no matter where the secondary particle (carrying the imaging information) strikes the detector and collection anode surface. Thus, the design of the multiplicity of grids, the resistive grid, or the deflector electrodes could be optimized solely for more uniform current into the detector and collection anode. Embodiments of the present invention are also applicable for those alternative situations in which the imaging particles carry both intensity and positional information. In these cases, we are not free to ignore where on the detector the secondary particle strikes, and the collection anode will generally comprise multiple individual detectors, each collecting (amplified) current from a small region of the multichannel plate. This contrasts with the detector system 200 in FIG. 2, where a single collection anode 211 receives all the amplified signal current generated by detector 210, regardless of where on detector 210 the original secondary particle arrived. FIGS. 9 and 10 discuss two exemplary cases of the application of the present invention to imaging detectors—other cases also fall within the scope of the present invention.

FIG. 9 shows an application of the present invention to a detector system 900 of a transmission electron microscope (TEM). In a TEM, a condenser and projector optics system projects a beam 902 of primary electrons onto the surface of a sample 904 to be imaged. As shown in FIG. 9, electrons 906 and 907 are scattered from various locations within sample 904. For simplicity, electrons 906 and 907 represent particular electron trajectories which are deflected within sample 904 at angles such that electrons 906 and 907 pass undeflected through lens 908, then travel downwards to the detector system comprising multiple annular grids (including outermost grid 932 and innermost grid 933) supported by ring electrode 930, and then into a two-stage multichannel plate 934, and finally to collection anode assembly 936, comprising multiple collection elements (including elements 914 and 924). Not all electrons emerging from sample 904 pass through the center of lens 908—electrons 904 and 942 illustrate a typical envelope of scattered electrons which would pass through objective lens 908, then being focused by lens 908 onto annular grid 932. Due to the voltages applied to the annular grids, an outward radial force 950 on the secondary particles between lens 908 and the multiple annular grids is generated. As an example, trajectory 906 emerging from the bottom of sample 904 passes through lens 908, becoming trajectory 910 which is then deflected outwards by force 950 to become trajectory 912 entering the outermost annular grid 932. Trajectories 940 and 942 emerging from the same location on sample 904 become trajectories 944 and 946, respectively, after focusing by lens 908, arriving at approximately the same location on grid 932 as trajectory 912. After current amplification by the two-stage multichannel plate 934, a current proportional to the current passing through grid 932 is collected on element 914 of the collection anode assembly 936—note that the positional information carried by the input signal passing through grid 932 is preserved by using a collection anode assembly 936, instead of a single collector anode (such as collector anode 211 in FIG. 2).

Electron trajectory 907, much nearer the axis, passes through lens 908, becoming trajectory 920 which is then deflected outward by force vector 950 to become trajectory 922 entering the innermost annular grid 933, and then, after current amplification, the signal current is collected by element 924 of collection anode assembly 936. Again, the positional information in the input signal reaching the grid has been preserved (it has just been stretched radially outwards in a 1:1 mapping that can be calibrated or calculated in advance). FIG. 9 shows an imaging detector embodiment of the present invention—in the absence of the segmented collection grid assembly, the electron trajectories reaching the multichannel plate 934 and collection anode assembly 936 would be more concentrated near the center of the MCP 934. This can be seen by extrapolating trajectories 910 and 920 without radial outward force vectors 950 all the way to the entrance plane of the grid assembly. Clearly, then, the imaging signals generated from collection anode assembly 936 would arise from a smaller number of collection elements near element 924, and elements 914 at the outer edge of the collection anode assembly would not receive any current at all. Two potential advantages of some embodiments of the present invention for imaging detector applications can now be seen:

1) The damage and/or contamination of the detector 934 will be more uniform, leading to longer detector lifetimes—this is the same benefit as was found above for non-imaging detectors.
2) The imaging resolution is potentially increased, since now a larger number of collection elements are used (such as outer element 914) than would be the case for a beam which was more concentrated near the center of the detector assembly 934 and collection anode assembly 936.

FIG. 10 shows an embodiment of the present invention applied to a detector system 1000 of a scanning transmission electron microscope (STEM). In a STEM, a beam 1002 of electrons is focused onto the surface of a sample 1004 and scanned in a raster pattern by a deflection system to generate an image, similar to the imaging process in a scanning electron microscope (SEM). As the electron beam 1002 passes through the sample 1004, electrons in the beam are scattered by nuclei in the sample 1004 (leading to "elastic scattering") and electrons in the sample 1004 (leading to "inelastic scattering"). As an example, electrons 1008 are scattered at larger angles, characteristic of elastically-scattered electrons. Electrons 1011 have small scattering angles, and may be inelastically-scattered. Both types of electrons contain important structural and compositional information about the sample 1004, and it is preferred to configure the detector system 1000 to simultaneously collect both imaging signals. It is well known in the art that the ratio of the elastic signal to the inelastic signal is proportional to the local atomic number of the sample. Typically, the STEM detector optics will comprise a lens 1010 below the sample 1004 (often this lens is formed by that portion of the objective lens magnetic field which is below the sample plane, but additional lenses may also contribute to the net focusing effect illustrated by the single lens 1010 in FIG. 10). Off-axis trajectory 1008 is focused by lens 1010, resulting in trajectory 1009. Similarly, near-axis trajectory 1011 is focused by lens 1010, resulting in trajectory 1012 (aberrations in lens 1010 are neglected here). In the absence of the radial outward forces 1050, trajectories 1009 and 1012 would reach the collection grid near the axis (at the center). With radial outward forces 1050 generated by the voltages on the annular grids (such as grids 1032 and 1033) in the collection grid assembly, the input signal currents reaching the two-stage multichannel plate 1034 and then the collection anode assembly 1036 fill a larger portion of the respective available detector and collection areas. For example, trajectory 1009 is deflected outwards, becoming trajectory 1014 which passes through outermost annular grid 1032, and then the corresponding (amplified) current reaches outermost collection element 1016. Similarly, trajectory 1012 is deflected outwards, becoming trajectory 1024 which passes through innermost annular grid 1033, and then the corresponding (amplified) current reaches innermost collection element 1026. Again, note that the scattering angle information carried by signals 1008 and 1011 is preserved, along with the image intensity information carried in the relative currents in signals 1008 and 1011. As in all scanning systems (such as SEMs and STEMs), positional information is in the time that the signal is collected, being correlated with the (known) position of the beam during raster scanning. The same two benefits discussed for FIG. 9 also apply here—increased detector lifetime and potentially improved imaging resolution.

With a small modification, FIG. 10 can also apply to the case of electron diffraction in the STEM. If the primary beam 1002 is made nearly parallel and illuminates a somewhat larger area of the sample 1004, while not being raster scanned across sample 1004, it is possible to acquire an electron diffraction image—in this case, the various trajectories 1008 and 1010 would correspond to different scattering angles. All other considerations discussed above would apply to this example, as well.

Although embodiments of the present invention and their advantages have been described in detail, it should be understood that various changes, substitutions and alterations can be made to the embodiments described herein without departing from the spirit and scope of the invention as defined by the appended claims. The voltage source for the grids may come from a single power source and use a voltage divider, separate power sources can be used for each grid, or some combination of voltage drivers and power sources may be used. While the examples provide an electric field to alter the trajectories of the secondary particles, a magnetic field could be used, although the effect of the magnetic field on the primary beam must be considered. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

I claim as follows:

1. A charged particle system, comprising:
a charged particle column for focusing a primary charged particle beam onto the surface of a target, wherein the impact of the charged particle beam with the target induces emission of secondary particles from the target;
a charged particle detector assembly including:
a detector for producing an electrical signal corresponding to the number of charged particles impacting the detector;
at least one grid, positioned between the charged particle detector and the surface of the target for causing charged particles to move from the target to the detector; and
a source of a field that deflects the secondary charged particles to reduce the maximum current density of the charged particles impinging on the charged particle detector by spreading the impinging particles more evenly over the detector, thereby prolonging the useful life of the charged particle detector.

2. The charged particle system of claim 1 wherein:
the at least one grid comprises at least two grids; and
the source of the field that deflects the secondary charged particles to reduce the maximum current density of the charged particles impinging on the charged particle detector comprises different potentials on the different ones of the at least two grids.

3. The charged particle system of claim 1 wherein:
the at least one grid comprises at least one resistive grid; and
the source of the field that deflects the secondary charged particles to reduce the maximum current density of the charged particles impinging on the charged particle detector comprises different potentials on the different parts of the at least one resistive grid.

4. The charged particle system of claim 1 wherein the source of the field that deflects the secondary charged particles to reduce the maximum current density of the charged particles impinging on the charged particle detector comprises deflector electrodes positioned between the at least one grid and the target.

5. The charged particle system of claim 1 wherein the source of the field that deflects the secondary charged particles to reduce the maximum current density of the charged particles impinging on the charged particle detector comprises a source of a field that deflects the secondary charged particles away from the axis of the charged particle column.

6. The charged particle system of claim 1 wherein the charged particle detector comprises a multichannel plate and a collection anode; a PIN diode; or a scintillator-photomultiplier with a light optical coupling means positioned between the scintillator and the photomultiplier, configured to transmit light emitted by the scintillator into the photomultiplier.

7. The charged particle system of claim 1 wherein the charged particle beam is an electron beam or a focused ion beam, and wherein the voltages on the at least one grid and the voltages on the charged particle detector are configured to collect secondary electrons.

8. The charged particle system of claim 1 wherein the charged particle beam is a focused ion beam, and wherein the voltages on the at least one grid and the voltages on the charged particle detector are configured to collect secondary ions.

9. The charged particle system of claim 1 wherein the charged particle beam is a focused ion beam, and wherein the source of the field that deflects the secondary charged particles to reduce the maximum current density of the charged particles impinging on the charged particle detector is configured to collect secondary ions.

10. The charged particle system of claim 1 in which the source of the field that deflects the secondary charged particles to reduce the maximum current density of the charged particles impinging on the charged particle detector deflects the secondary particles in a manner that maintains the relative positions of the secondary particles from the optical axis of the column.

11. A method of reducing the rate of damage or contamination in a secondary particle detector in a charged particle system, comprising:
providing a charged particle column to focus a charged particle beam onto the surface of a target, wherein the impact of the charged particle beam with the target induces the emission of secondary particles from the target;
providing a secondary particle detector to collect a portion of the secondary particles emitted from the target;

providing a field to deflect the secondary charged particles to reduce the maximum current density of the charged particles impinging on the charged particle detector by spreading the impinging particles more evenly over the detector, thereby prolonging the useful life of the charged particle detector.

12. The method of claim 11 further comprising providing at least one grid to accelerate secondary particles from the surface toward the secondary particle detector.

13. The method of claim 12, wherein providing at least one grid includes providing a resistive grid, and further comprising a first voltage to one portion of the resistive grid and a second voltage to a second portion of the resistive grid, wherein the first and second voltages are unequal.

14. The method of claim 12 wherein:
providing at least one grid includes providing two grids; and
providing a field to deflect the secondary charged particles to reduce the maximum current density of the charged particles impinging on the charged particle detector comprises providing different potentials on the different ones of the at least two grids.

15. The method of claim 12 wherein:
providing at least one grid includes providing at least one resistive grid; and
providing a field to deflect the secondary charged particles to reduce the maximum current density of the charged particles impinging on the charged particle detector comprises providing different potentials on the different parts of the at least one resistive grid.

16. The method of claim 12 wherein providing a field to deflect the secondary charged particles to reduce the maximum current density of the charged particles impinging on the charged particle detector comprises providing deflector electrodes positioned between the at least one grid and the target.

17. The method of claim 11 further in which providing a secondary particle detector includes providing a secondary particle detector between the column and the target.

18. The method of claim 11 wherein providing a field to deflect the secondary charged particles to reduce the maximum current density of the charged particles impinging on the charged particle detector comprises providing a field that deflects the secondary particles away from the axis of the charged particle column.

19. The method of claim 11 wherein providing a secondary charged particle detector comprises providing a multichannel plate and a collection anode; a PIN diode; or a scintillator-photomultiplier with a light optical coupling means positioned between the scintillator and the photomultiplier, configured to transmit light emitted by the scintillator into the photomultiplier.

20. The method of claim 11 wherein providing a charged particle column includes providing an electron beam or a focused ion beam, and wherein the secondary particle collector collects secondary electrons.

21. The method of claim 11 wherein providing a charged particle column includes providing a focused ion beam, and wherein the secondary particle collector collects secondary ions.

22. A charged particle system, comprising:
a charged particle column for focusing a primary charged particle beam onto the surface of a target;
a charged particle detector assembly including:
a detector for producing an electrical signal corresponding to the number of charged particles impacting the detector;
at least one grid, positioned between the charged particle detector and the surface of the target for causing charged particles to move from the target to the detector;
a source of a field that deflects the secondary charged particles to reduce the maximum current density of the charged particles impinging on the charged particle detector by spreading the impinging particles more evenly over the detector, thereby prolonging the useful life of the charged particle detector.

* * * * *